(12) United States Patent
Lin

(10) Patent No.: US 6,424,559 B1
(45) Date of Patent: Jul. 23, 2002

(54) METHOD AND APPARATUS FOR SENSE AMPLIFICATION

(75) Inventor: Jeffrey Lin, Danville, CA (US)

(73) Assignee: JMOS Technology, Inc., Fremont, CA (US)

( * ) Notice: Subject to any disclaimer, the term of this patent is extended or adjusted under 35 U.S.C. 154(b) by 0 days.

(21) Appl. No.: 09/675,616

(22) Filed: Sep. 29, 2000

(51) Int. Cl.[7] ............................................. G11C 11/24
(52) U.S. Cl. ...................... 365/149; 365/190; 365/205
(58) Field of Search ............................... 365/190, 149, 365/205, 129, 189.01

(56) References Cited

U.S. PATENT DOCUMENTS

| | | | | |
|---|---|---|---|---|
| 5,604,705 A | * | 2/1997 | Ackland et al. ............. 365/205 |
| 5,627,785 A | * | 5/1997 | Gilliam et al. ......... 365/189.01 |
| 5,768,178 A | * | 6/1998 | McLaury .................... 365/149 |

\* cited by examiner

*Primary Examiner*—Hoai V. Ho
(74) *Attorney, Agent, or Firm*—Blakely, Sokoloff, Taylor & Zafman LLP

(57) ABSTRACT

A method and apparatus for sense amplification is disclosed. In one embodiment, this is a method of amplifying signals in a DRAM including sharing charge between a cell and a first conductor of a first pair of complementary conductors; and driving a voltage of the first conductor of the first pair and a voltage of a second conductor of the first pair in the same direction relative to a power supply voltage.

In an alternate embodiment, this is an apparatus. The apparatus includes a first transistor having a first terminal, a second terminal and a gate. The apparatus also includes a second transistor having a first terminal, a second terminal and a gate, the gate of the second transistor coupled to the first terminal of the first transistor, the first terminal of the second transistor coupled to the gate of the first transistor. Moreover, the apparatus also includes a third transistor having a first terminal, a second terminal, and a gate, the first terminal of the third transistor coupled to the second terminal of the first transistor and the second terminal of the second transistor, the gate of the third transistor coupled to a power enable conductor, the second terminal of the third transistor coupled to a power supply node.

In another alternate embodiment, this is a DRAM cell array. The DRAM cell array includes a set of cells selectively coupled to a bitline conductor and a set of cells selectively coupled to a bitline bar conductor. The DRAM cell array also includes a half sense amplifier coupled to the bitline conductor and to the bitline bar conductor.

8 Claims, 10 Drawing Sheets

METHOD AND APPARATUS FOR SENSE AMPLIFICATION

BACKGROUND OF THE INVENTION

1. Field of the Invention

This application generally relates to semiconductor memories and more specifically to sense amplification suitable for DRAM circuitry which may employ a hierarchical structure.

2. Description of the Related Art

Generally, DRAM is built as a separate integrated circuit chip from any digital logic, thus allowing for use of a specialized DRAM process and structures such as trench or other 3D capacitors. Such structures may be used to create high capacitance structures in small areas, thus leading to high DRAM cell density on the DRAM chips. However, these structures are not compatible with logic processes, and the large capacitances may lead to high power consumption and high temperatures.

For memory on integrated circuit chips created through use of a logic process, SRAM memory has typically been used. However, SRAM memory is often much less dense than DRAM memory. As a result, SRAM requires more space on a chip than DRAM does. Also, SRAM may require more power and generate a higher temperature than DRAM.

Additionally, traditional DRAM designs have used a sense amplifier to sense whether the value stored in a DRAM cell is high or low. These sense amplifiers typically operate through a charge sharing mechanism, thus requiring that the capacitance of the DRAM cell be matched (close to a desired ratio) with other components of the DRAM device.

The sense amplifiers are traditionally configured as positive feedback latches similar to an SRAM cell which can be selectively coupled to a pair of complementary bit-lines (bit-line and bit-line bar). During the bitline pre-charge period, the two differential bitlines are set to the same voltage. After the wordline is activated or turns on, DRAM cells associated with the wordline start charge sharing between the DRAM cell capacitor and the associated bitline. Depending on the charge stored in the DRAM cell capacitor, the bitline or bitline bar will change voltage (move) accordingly and settle down to a new voltage value, which is an equilibrium value between the value on the capacitor and the pre-charged value of the bitline. Meanwhile, the complementary bitline will remain at the pre-charged value (voltage level).

After the charge sharing occurs and reaches an equilibrium, the sense amplifier is coupled to the two bit-lines. This coupling causes the sense amplifier to drive the two bitlines in opposite directions, one toward ground and the other toward a positive power supply voltage. In driving the two bitlines, the sense amplifier effectively amplifies the differential between the two bitlines, and this differential may be sensed in order to determine what value was stored in the DRAM cell which was used to cause charge sharing originally.

In a numerical example, if a Vcc of 5V is used, the pre-charge voltage of the two bitlines will be 2.5V. Once charge sharing occurs, one of the bitlines will be slightly lower or higher than 2.5V. For example, the bitline may be at 2.75V while the bitline bar is at 2.5V. When the two bitlines are coupled to the sense amplifier, the bitline is then driven to 5V and the bitline bar is driven to ground (0V) by the positive feedback action of the sense amplifier.

SUMMARY OF THE INVENTION

A method and apparatus for sense amplification is disclosed. In one embodiment, this is a method of amplifying signals in a DRAM including sharing charge between a cell and a first conductor of a first pair of complementary conductors; and driving a voltage of the first conductor of the first pair and a voltage of a second conductor of the first pair in the same direction relative to a power supply voltage.

In an alternate embodiment, this is an apparatus. The apparatus includes a first transistor having a first terminal, a second terminal and a gate. The apparatus also includes a second transistor having a first terminal, a second terminal and a gate, the gate of the second transistor coupled to the first terminal of the first transistor, the first terminal of the second transistor coupled to the gate of the first transistor. Moreover, the apparatus also includes a third transistor having a first terminal, a second terminal, and a gate, the first terminal of the third transistor coupled to the second terminal of the first transistor and the second terminal of the second transistor, the gate of the third transistor coupled to a power enable conductor, the second terminal of the third transistor coupled to a power supply node.

In another alternate embodiment, this is a DRAM cell array. The DRAM cell array includes a set of cells selectively coupled to a bitline conductor and a set of cells selectively coupled to a bitline bar conductor. The DRAM cell array also includes a half sense amplifier coupled to the bitline conductor and to the bitline bar conductor.

In yet another alternate embodiment, this is a method of amplifying. The method includes coupling a half sense amplifier to a bitline conductor and a bitline bar conductor. The method also includes amplifying a differential between the bitline conductor and the bitline bar conductor through operation of the half sense amplifier.

In still another alternate embodiment, this is an ASIC. The ASIC includes a digital logic circuit block and a DRAM circuit block, the DRAM circuit block including a set of cells coupled to a half sense amplifier.

Each of these embodiments may further include driving voltage of a first set of complementary conductors in the same direction relative to a ground potential and then driving voltage of a second set of complementary conductors in opposite directions relative to a ground potential when the second set of complementary conductors are coupled to the first set of complementary conductors or circuitry configured to achieve these results.

BRIEF DESCRIPTION OF THE DRAWINGS

The present invention is illustrated by way of example and not limitation in the accompanying figures.

DETAILED DESCRIPTION

A method and apparatus for sense amplification is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment, nor are separate or alternative embodiments mutually exclusive of other embodiments.

The method and apparatus for sense amplification include use of a half senseamplifier, and may further include use of hierarchical bit-line structures and DRAM implemented on a digital logic process. In the hierarchical bitline scheme, the bitline and bitline bar are coupled to a pair of complementary higher-level bitlines called hbl and hbl-bar. Typically, multiple pairs of bitline and bitline bar lines are connected or coupled to a single hbl and hbl-bar pair, resulting in a streamlined datapath design.

Coupled to the bitline pairs are Half Sense Amplifiers (HSAs) which use a simple design consisting of either only cross-coupled PMOS or cross-coupled NMOS devices to achieve bitline signal amplification. These HSAs employ three transistors each instead of the six transistors of a full sense amplifier (FSA) design, and thus may be expected to use less area.

Although the HSA does not obtain the same voltage separation on the bitline and bitline bar lines before sensing, a second charge sharing operation between the higher-level bitlines (hbl and hbl-bar) and the bitline and bitline bar combined with use of FSA sensing on the hbl and hbl-bar lines can fully restore the voltage level on the bitline and bitline bar, just as the conventional sense amplifier restores the voltages after sensing occurs.

Figure 1:
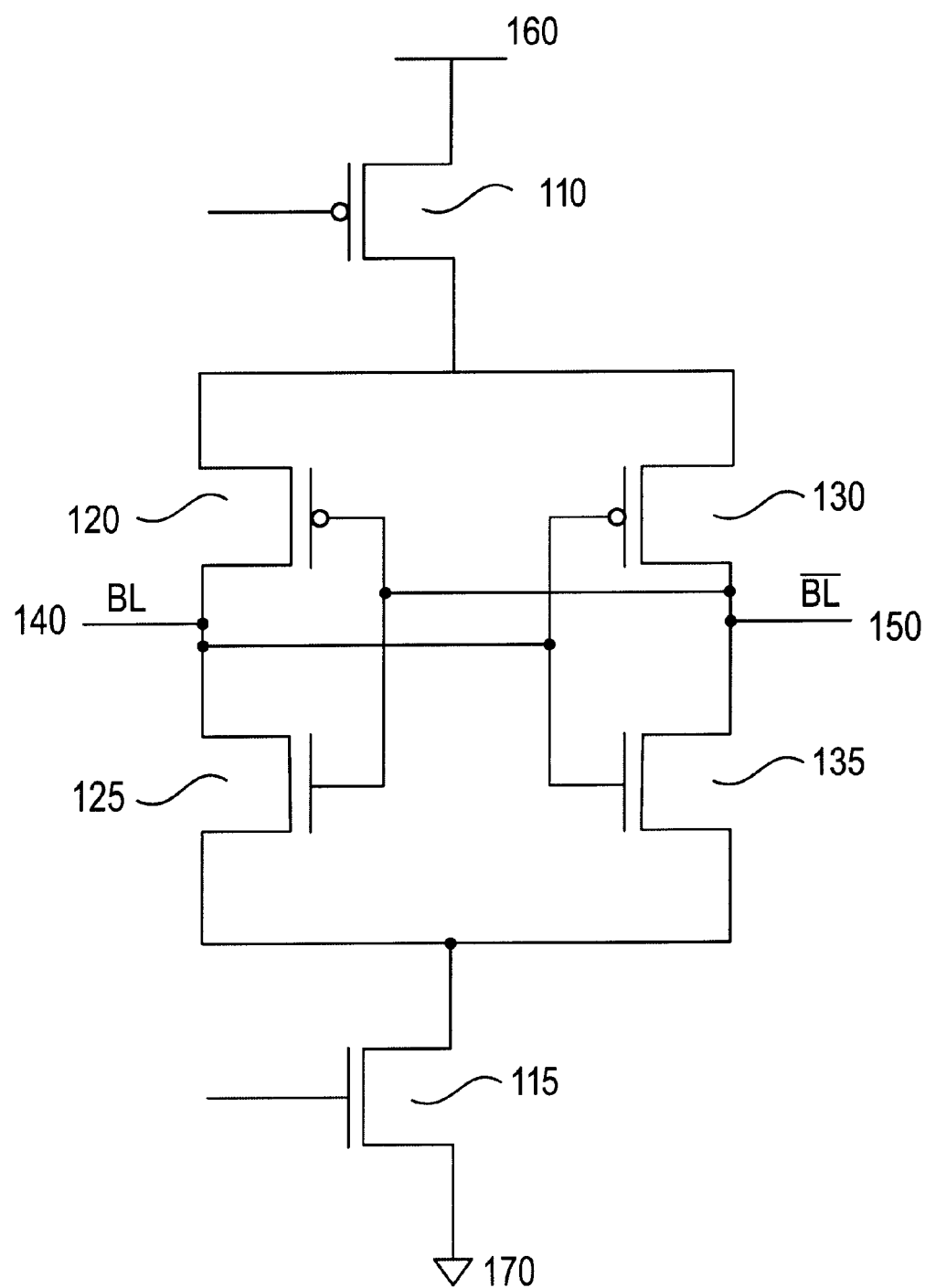
FIG. 1 illustrates an embodiment of a full sense amplifier.

FIG. 1 illustrates an embodiment of a full sense amplifier. In the full sense amplifier, the bitline (140) and bitline bar (150) signals are initially at slightly different voltage levels, and a feedback mechanism causes these voltage levels to diverge, resulting in a voltage differential which may be detected by a later-stage amplifier or buffer circuit. The sense amplifier is composed of two cross-coupled inverters. The first inverter includes PMOS transistor 130 and NMOS transistor 135, whereas the second inverter includes PMOS transistor 120 and NMOS transistor 125. The power supply voltage 160 is coupled to a PMOS transistor 110, which is in turn coupled to PMOS devices 120 and 130. The ground terminal 170 is also coupled to a NMOS transistor 115, which in turn is coupled to the NMOS device s 125 and 135.

In operation, the circuit typically operates by having the devices (110, 115) turned off to precharge the two bitlines to Vcc/2. Then charge sharing between the cell capacitor of a DRAM device and the bitline (140) and bitline bar (150) lines will result in a small voltage differential between the bitline (140) and bitline bar (150). Once devices 110 and 115 are turned on, if bitline (140) is at a higher potential than bitline bar (150), the feedback of the amplifier will cause bitline (140) to rise in potential to a voltage close to the power supply voltage 160 and bitline bar (150) to fall in potential to a voltage close to the ground potential 170.

Figure 2A:
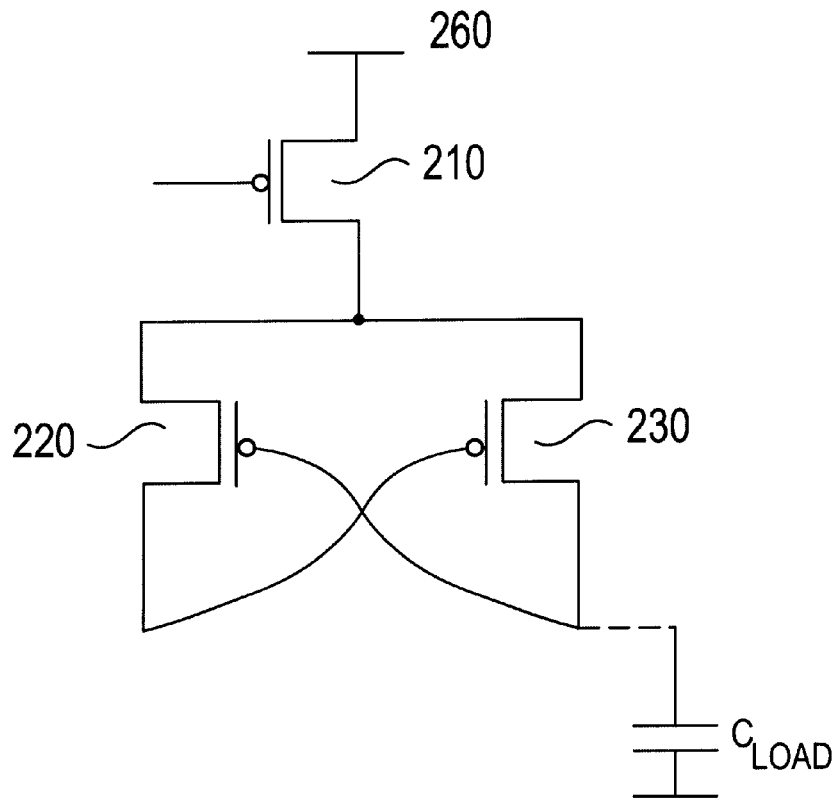
FIG. 2a illustrates an embodiment of a half sense amplifier.

FIG. 2a illustrates an embodiment of a half sense amplifier. PMOS transistor 210 is coupled to both power supply terminal 260 and to source/drain terminals of PMOS devices 220 and 230. PMOS devices 220 and 230 are in turn cross-coupled, such that the gate of device 220 is coupled to a source/drain terminal of device 230 and the gate of device 230 is coupled to a source/drain terminal of device 220. By coupling the gate of device 220 to a bitline and the gate of device 230 to a bitline bar, a similar amplification of the voltage differential between these signals may be achieved. However, in this instance, if the bitline potential is slightly higher than the bitline bar potential, the tendency is to have the bitline potential rise to nearly the potential of the power supply 260, while the bitline bar potential rises only slightly.

In one embodiment, the power supply voltage 260 is approximately Vcc, the bitline potential is Vcc/2+ΔV and the bitline bar potential is Vcc/2. After operation of the half sense amplifier, the bitline potential is close to Vcc while the bitline bar potential is much closer to (but higher than) Vcc/2.

Figure 2B:
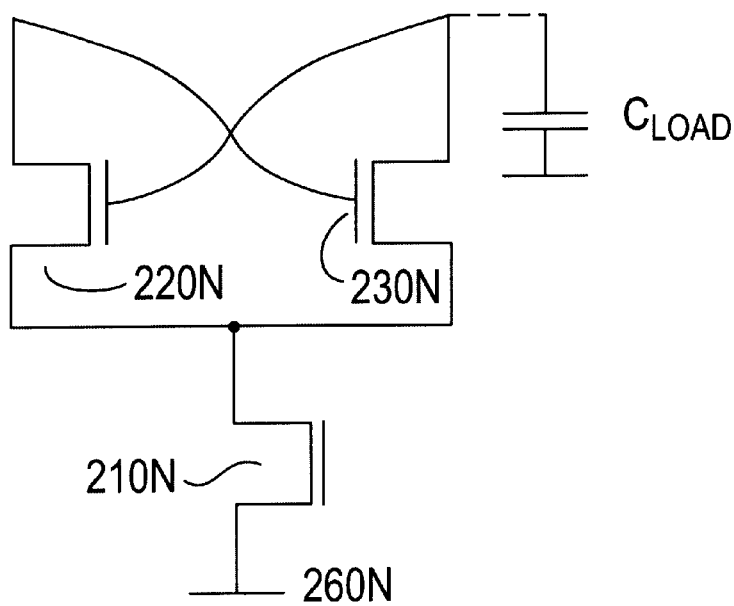
FIG. 2b illustrates an alternate embodiment of a half sense amplifier.

FIG. 2b illustrates an alternate embodiment of a half sense amplifier, utilizing NMOS devices instead of PMOS devices. It will be appreciated that the operation of the half sense amplifier of FIG. 2b may be understood by comparing it to the operation of the half sense amplifier of FIG. 2a. In each embodiment, the voltage levels on the two bitlines (bitline and bitline bar) are driven in the same direction (toward Vcc or toward ground or Vdd), unlike the traditional configuration which drives the signals only in opposite directions. Driving in the same direction may seem counterintuitive, as the separation of the two voltage signals is desired.

Figure 3:
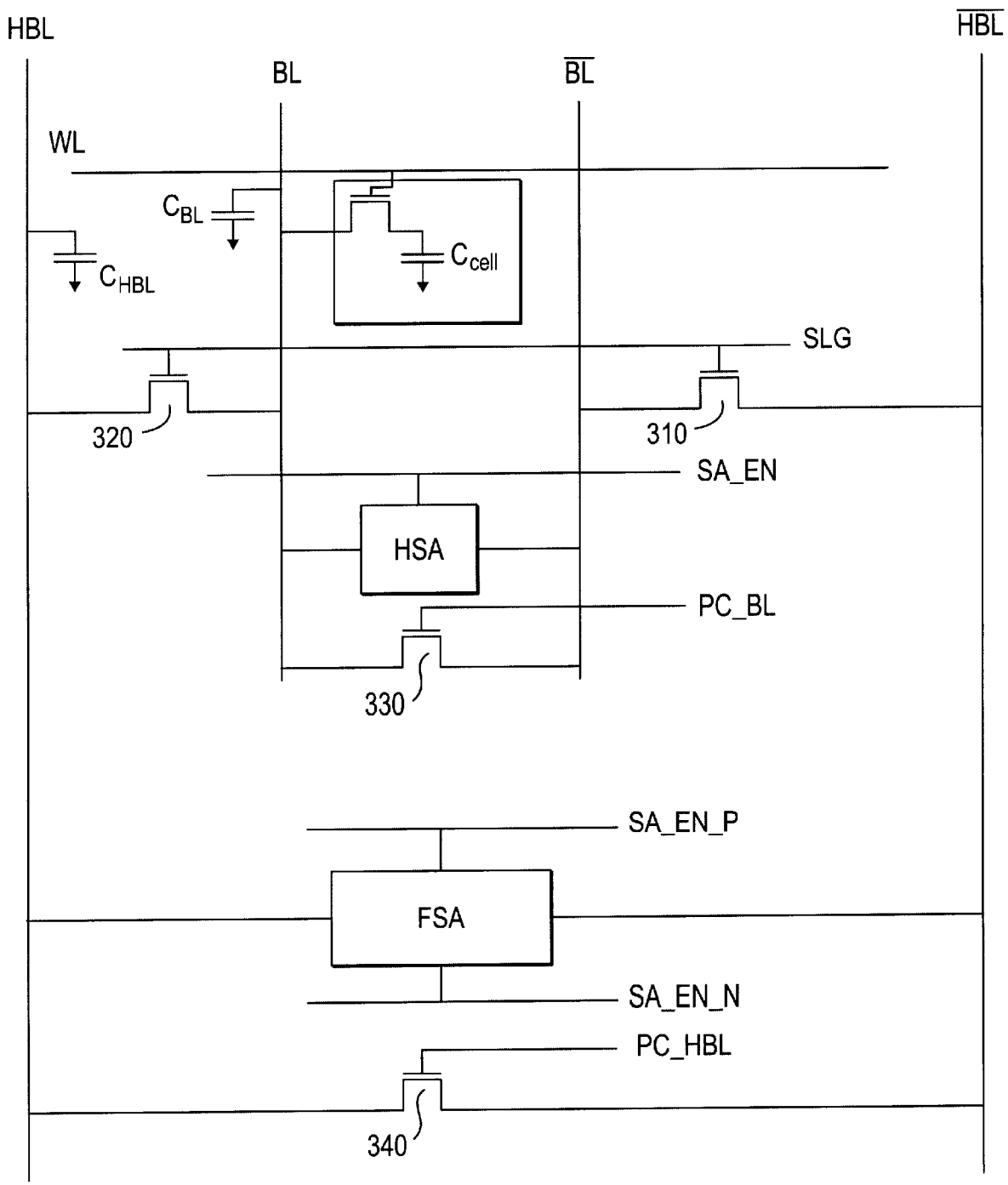
FIG. 3 illustrates an embodiment of a DRAM utilizing a hierarchical bit-line structure.

FIG. 3 illustrates an embodiment of a DRAM utilizing a hierarchical bit-line structure. The cell (cell) with a capacitance $C_{cell}$ is coupled to both a wordline (WL) and a bitline (BL). In one embodiment, the ratio of the capacitance $C_{BL}$ and the capacitance $C_{cell}$ is designed to be on the order of 10:1, such that the charge sharing that occurs when the capacitance $C_{cell}$ is coupled to the capacitance $C_{BL}$ results in a 100 mV swing on $C_{BL}$ for 1 V difference between $C_{cell}$ and $C_{BL}$. The cell is coupled to the bitline (BL) when the wordline (WL) is selected, and the capacitance $C_{BL}$ represents the parasitic capacitance of the bitline (BL).

The cell is part of an array of cells, all of which are connected to either bitline (BL) or bitline bar (BL_bar). In one embodiment, 32 cells are connected to each bitline (BL) and 32 cells are connected to each bitline bar (BL_bar). Also connected to bitline (BL) and bitline bar (BL_bar) is a half sense amplifier (HSA). The HSA also has an enable (precharge) input (SA_EN). Furthermore, coupled between the bitline (BL) and bitline bar (BL bar) is a pass transistor 330 with an input PC_BL coupled to its gate. Device 330 is turned on in order to connect (short) BL and BL_bar, resulting in charge sharing which neutralizes the voltage differential between the two lines or precharges the two lines after a sensing operation is complete.

Coupling the bitline or first bitline (BL) to a hierarchical bitline or second bitline (HBL) is a pass transistor 320 with an SLG input coupled to its gate. Similarly, the SLG input is coupled to a gate of a pass transistor 310, which couples the bitline bar (BL_bar) to a hierarchical bitline bar (HBL_bar). The capacitance $C_{HBL}$ is the parasitic capacitance of the hierarchical bitline (HBL), and in one embodiment, the ratio of the capacitance $C_{HBL}$ to the capacitance $C_{BL}$ is also designed to be about 10:1.

Coupled to the hierarchical bitline (HBL) and the hierarchical bitline bar (HBL_bar) is a full sense amplifier (FSA). The FSA also has coupled to it two power and ground enable inputs, SA_EN_P and SA_EN_N, which control PMOS and NMOS devices such as devices 110 and 115 of FIG. 1. Since the bitline (BL) is coupled to the hierarchical bit line (HBL), a capacitive charge sharing model may again be used, this time causing the voltage of the hierarchical bit line (HBL) to move as a result of charge sharing with the bitline (BL).

Figure 4:
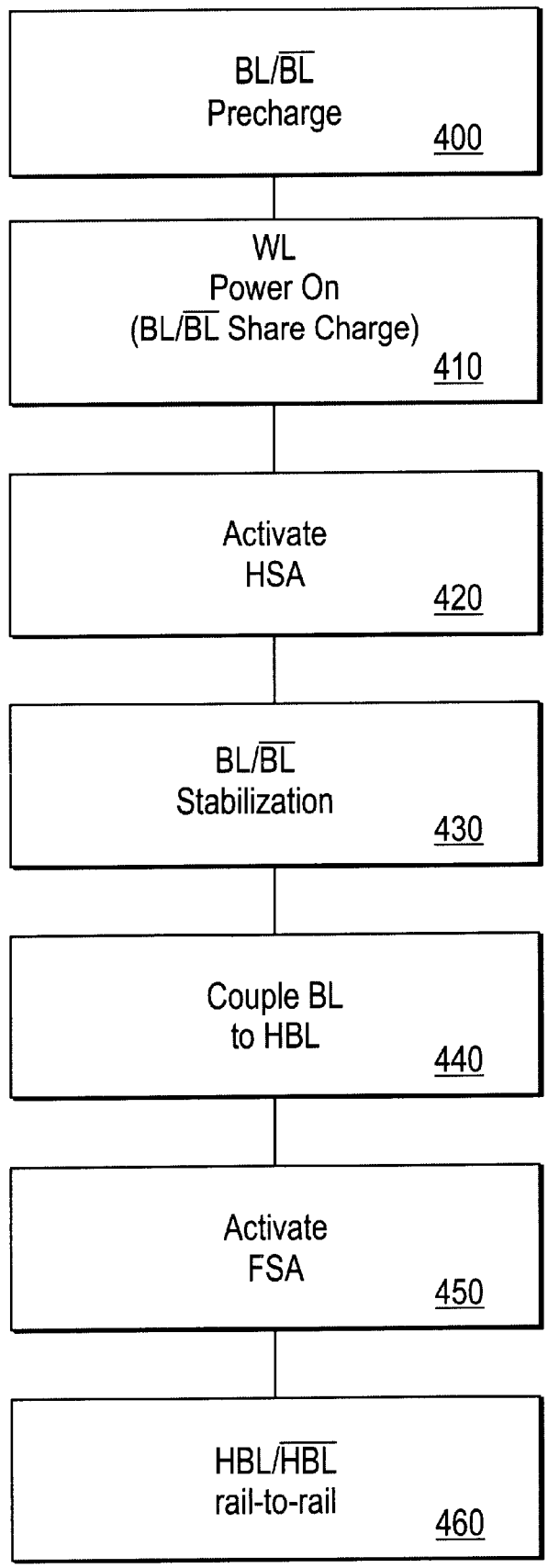
FIG. 4 illustrates an embodiment of a sensing process.

FIG. 4 illustrates an embodiment of a sensing process. At block 400, the wordline is off and both the bitline and bitline bar are neutralized to a precharged state (i.e. voltage is one half of the Vcc power supply). At block 410, the wordline is powered on, thus selecting a cell or a set of cells, and the bitline and bitline bar share charge with a selected cell capacitor, resulting in preloading of the half sense amplifier with a minimum differential voltage on the bitline and bitline bar. At block 420, the half sense amplifier is activated (coupled to the bitline and bitline bar), thus amplifying the differential voltage between the bitlines coupled to the cells and corresponding bitline bars. At block 430, the bitline and bitline bar conductors stabilize at the voltages they are driven to by the feedback operation of the half sense amplifier, namely approximately Vcc for the bitline and slightly over Vcc/2 for the bitline bar. At block 440, the bitline is coupled to the hierarchical bitline (HBL) and the bitline bar is coupled to a hierarchical bitline bar (HBL_bar) (such as by turning on devices 310 and 320 in the embodiment of FIG. 3 for example). As a result, the full sense amplifier is preloaded with a minimum differential voltage between HBL and HBL_bar at its inputs. At block 450, the full sense amplifier is activated, thus sensing the differential between the hierarchical bitline and the hierarchical bitline bar. At block 460, the hierarchical bitline and hierarchical bitline bar are driven to the positive and negative power rails or supply voltages by the full sense amplifier. Furthermore, the bitline and bitline bar signals are also driven to the rails, such as through the coupling achieved by the devices 310 and 320 as gated by the SLG signal in the embodiment of FIG. 3 for example.

Figure 8:
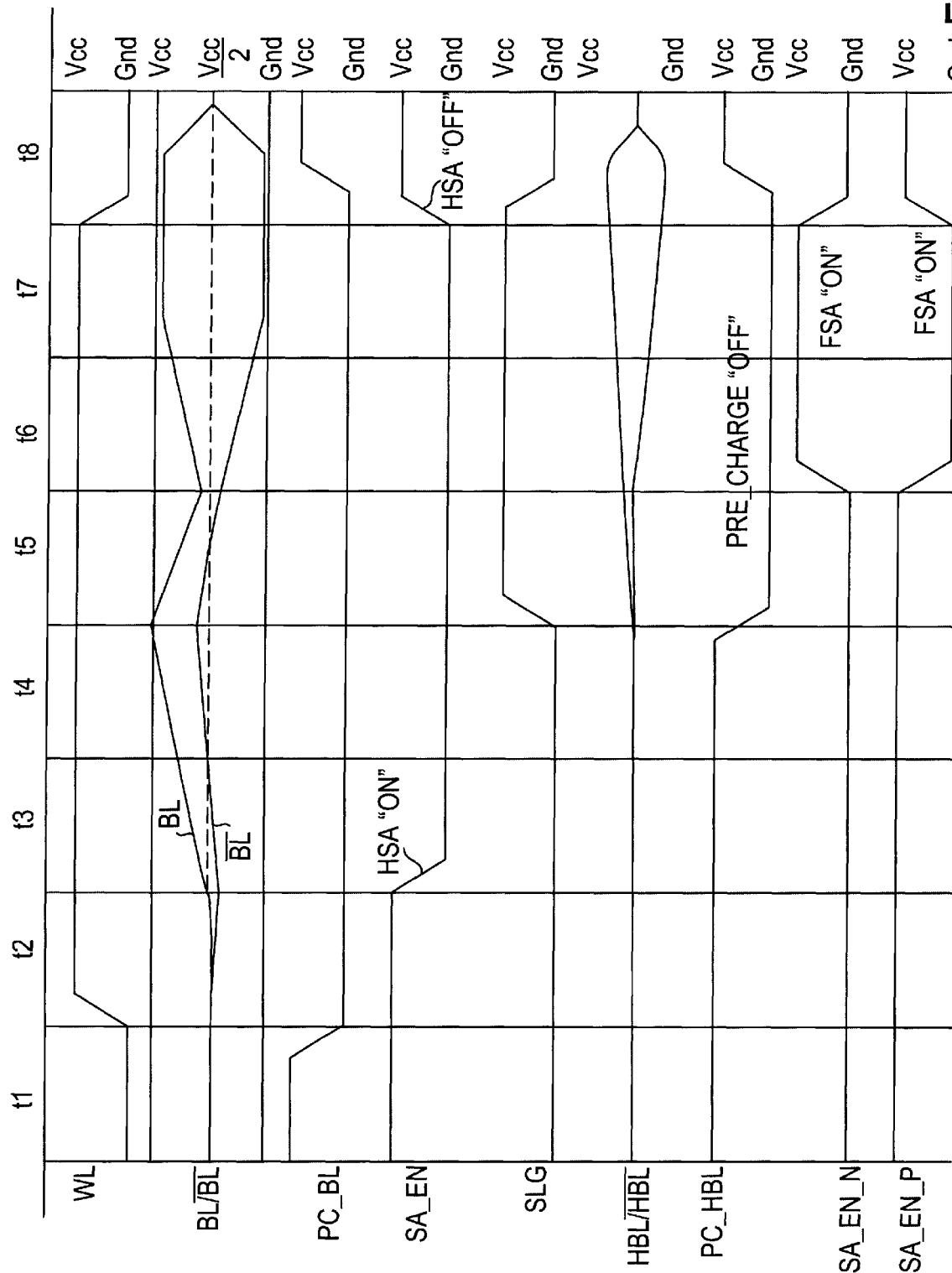
FIG. 8 illustrates timing of signals in an embodiment of a DRAM utilizing a hierarchical bit-line structure.
Figure 9:
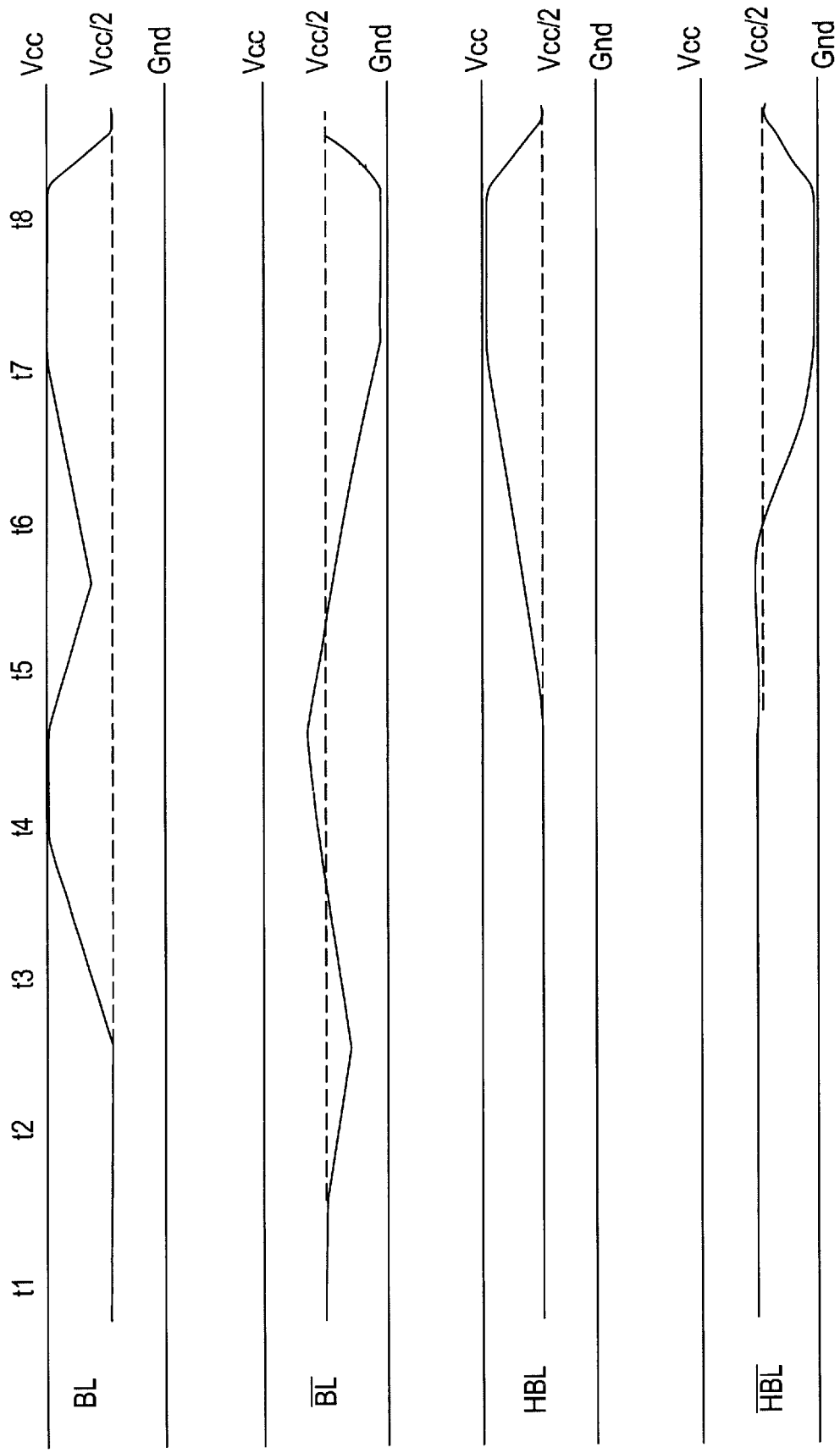
FIG. 9 also illustrates timing of signals in an embodiment of a DRAM utilizing a hierarchical bit-line structure.

For a further illustration of the processes illustrated in FIG. 4 as described above and FIGS. 5 and 6 as described below, reference may be made to FIGS. 8 and 9. Each of FIGS. 8 and 9 illustrate timing of signals in one embodiment of a DRAM utilizing a hierarchical bitline structure, when a cell coupled to a bitline bar if conductor (BL_bar) is sensed at a low value. Furthermore, each of FIGS. 8 and 9 correspond to a half-sense amplifier utilizing only a connection to Vcc through PMOS devices. FIG. 8 illustrates all of the signals in representative form, providing approximate waveforms and voltage values. FIG. 9 illustrates the bitline, bitline bar, hierarchical bitline and hierarchical bitline bar signals in a closeup view. FIG. 9 is similarly in representative form, providing approximate waveforms and voltage values.

Figure 5:
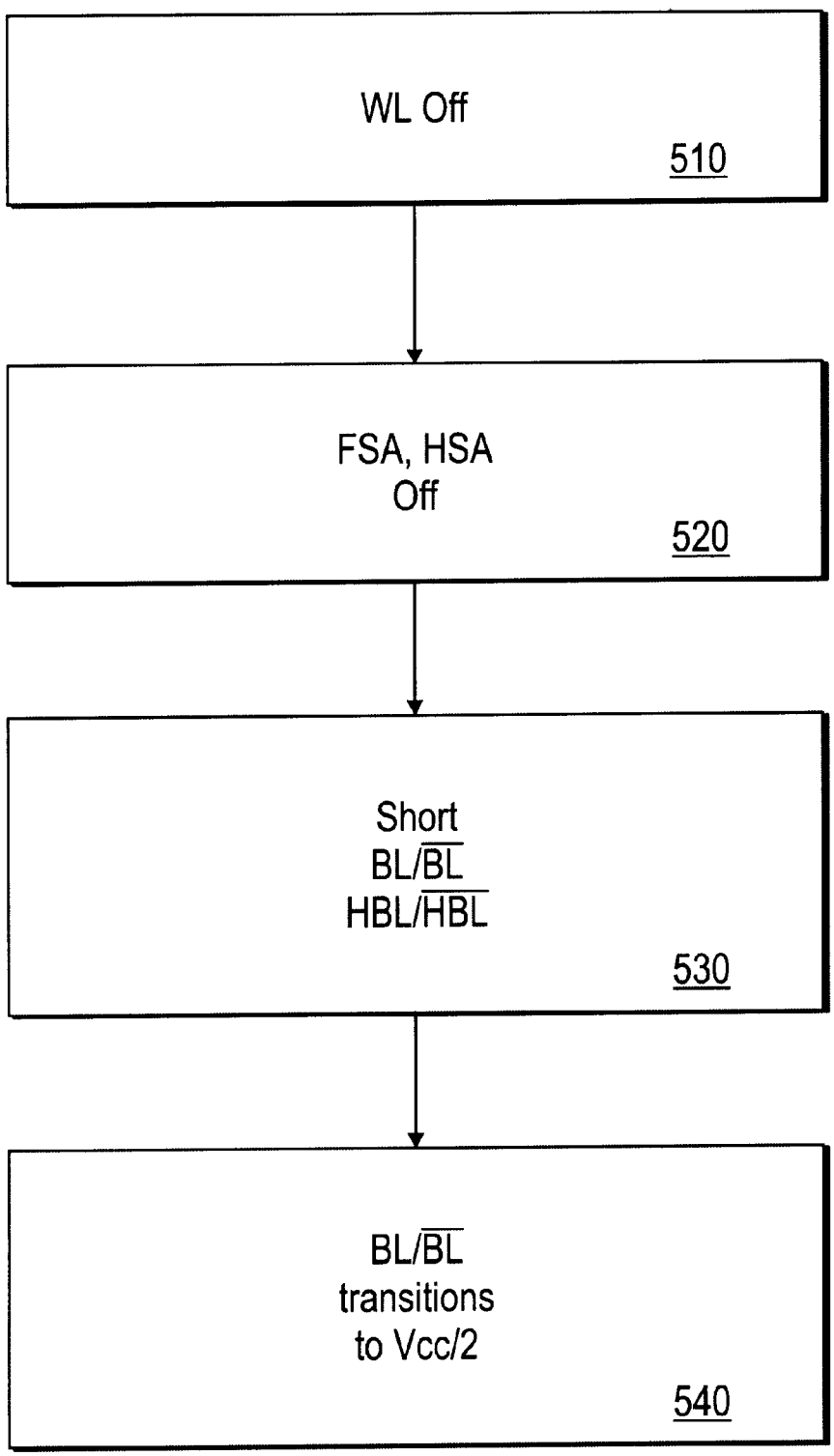
FIG. 5 illustrates an embodiment of a precharging process.

FIG. 5 illustrates an embodiment of a precharging process. At block 510, the wordline signal is turned off, thus deselecting the cell or set of cells and decoupling the cells from the bitline(s). At block 520, the full sense amplifier and half sense amplifier are turned off, thus leaving the bitline, bitline bar, hierarchical bitline and hierarchical bitline bar in an undriven state. At block 530, the bitline and bitline bar are shorted (such as through device 330 of the embodiment of FIG. 3 for example), and the hierarchical bitline and hierarchical bitline bar are shorted (such as through device 340 of the embodiment of FIG. 3 for example), causing charge sharing between the conductors. Note that since the bitline is coupled to the hierarchical bitline and the bitline bar is coupled to the hierarchical bitline bar during operation of the full sense amplifier, all four of the conductors are thus driven to the rails. As a result of shorting the bitline to the bitline bar and shorting the HBL to the HBL_bar, the corresponding charge sharing leaves each conductor at approximately Vcc/2 where Vcc is the power supply voltage, as reflected in block 540.

Figure 6:
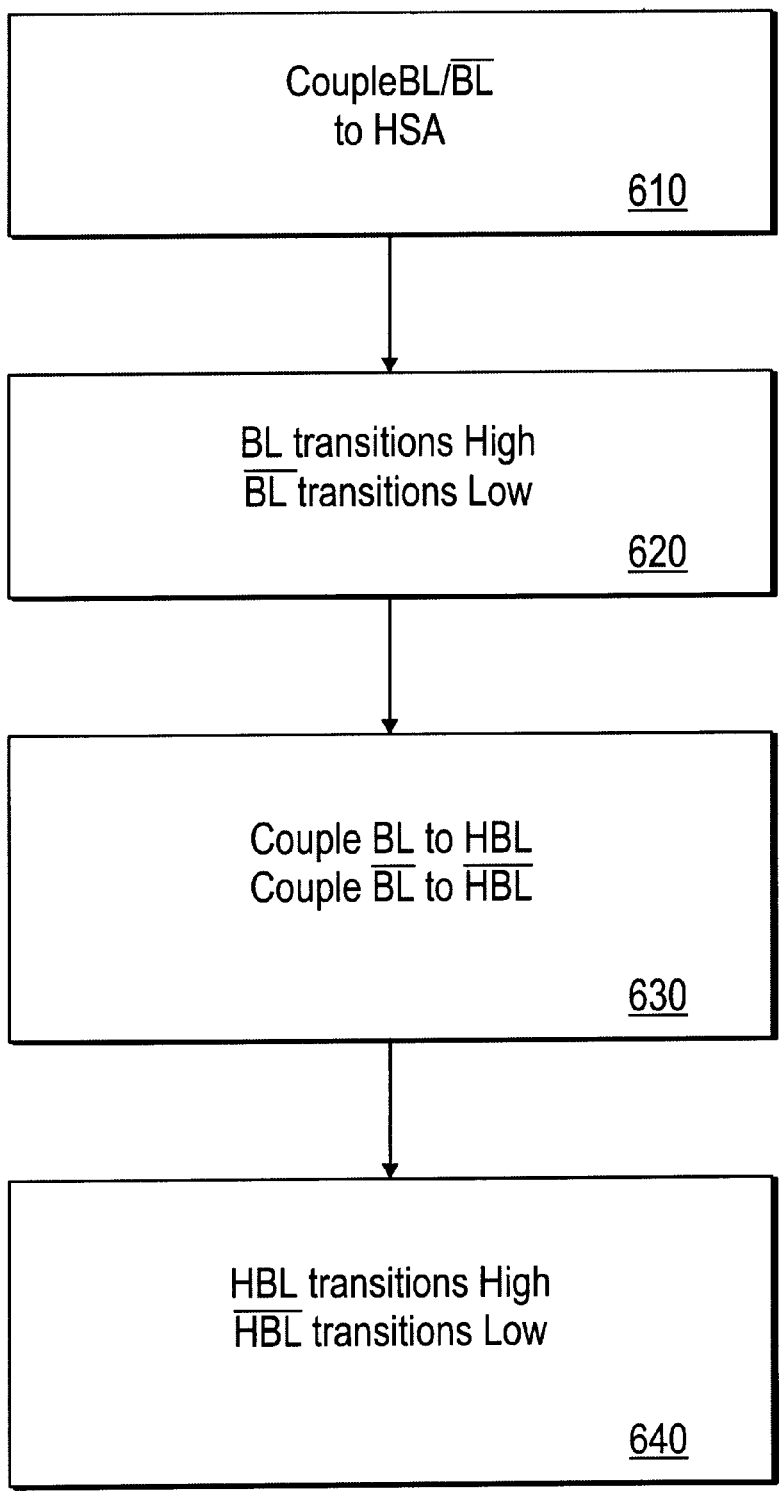
FIG. 6 illustrates an alternate embodiment of a sensing process.

FIG. 6 illustrates an alternate embodiment of a sensing process. At block 610, the bitline and bitline bar are coupled to the half sense amplifier, after charge sharing, the bitline is charged to a slightly higher (or lower) voltage than the bitline bar. At block 620, the bitline (or bitline bar) transitions to Vcc and the bitline bar (or bitline) is slightly increased in voltage. At block 630 the bitline is coupled to the hierarchical bitline and the bitline bar is coupled to the hierarchical bitline bar. At block 640, the hierarchical bitline (or hierarchical bitline bar) transitions to Vcc and the hierarchical bitline bar (or hierarchical bitline) transitions to ground as a result of operation of the full sense amplifier.

Figure 7:
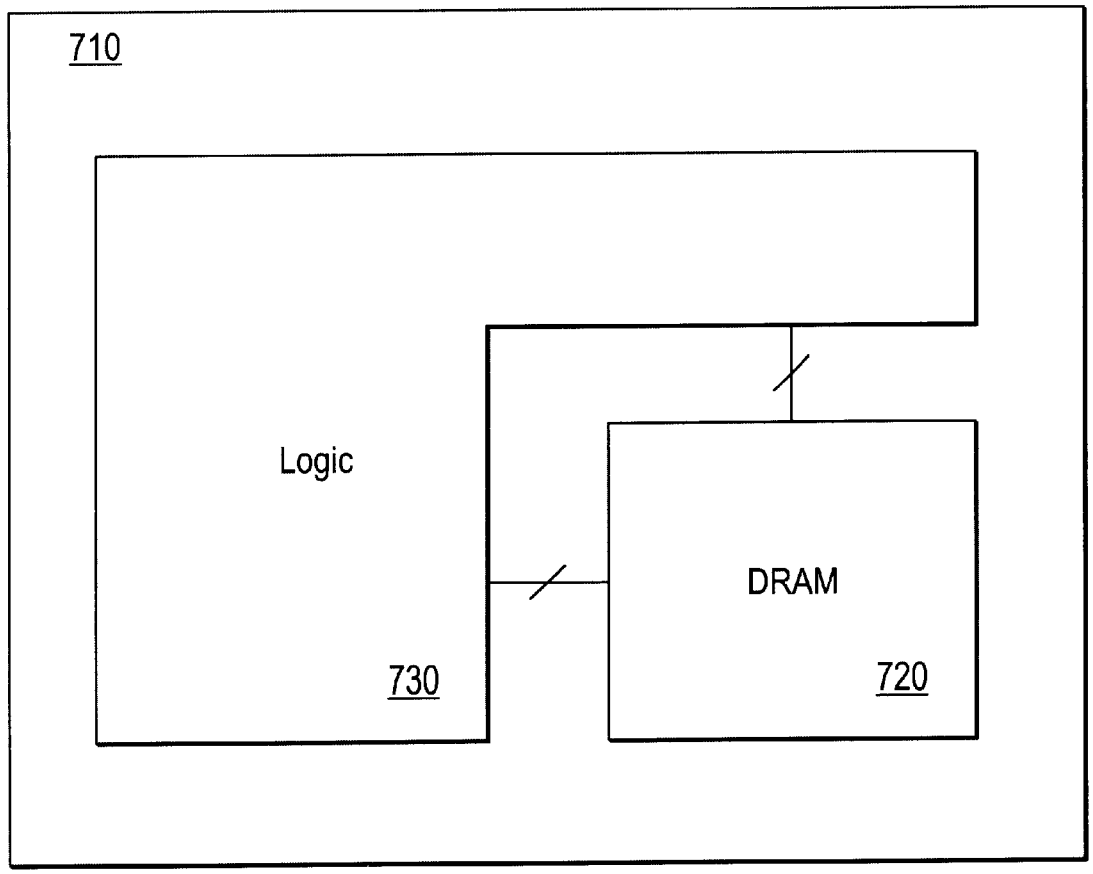
FIG. 7 illustrates an embodiment of an ASIC.

FIG. 7 illustrates an embodiment of an ASIC. ASIC 710 includes a digital logic section 730 and a DRAM section 720. It will be appreciated that such an ASIC must be fabricated using a process suitable for fabrication of digital devices, and will therefore not support fabrication of trench capacitors or other common DRAM devices. Thus, the DRAM devices must be fabricated using standard transistors (and/or capacitors), which require more space. However, by using hierarchical bitline structures, half sense amplifiers may be employed for blocks of cells, and then a full sense amplifier may be employed for multiple blocks of half sense amplifiers. Thus, space is saved relative to a traditional DRAM design. Furthermore, the capacitance of each DRAM cell need not be as high, since two levels of charge sharing and amplification occur, thus allowing for fabrication of a DRAM cell with a capacitance lower than that of the traditional DRAM cell. While such a design may be particularly well suited to implementation in a logic process, the half sense amplifier and hierarchical bitline structures are in no way limited to such a process.

Figure 10:
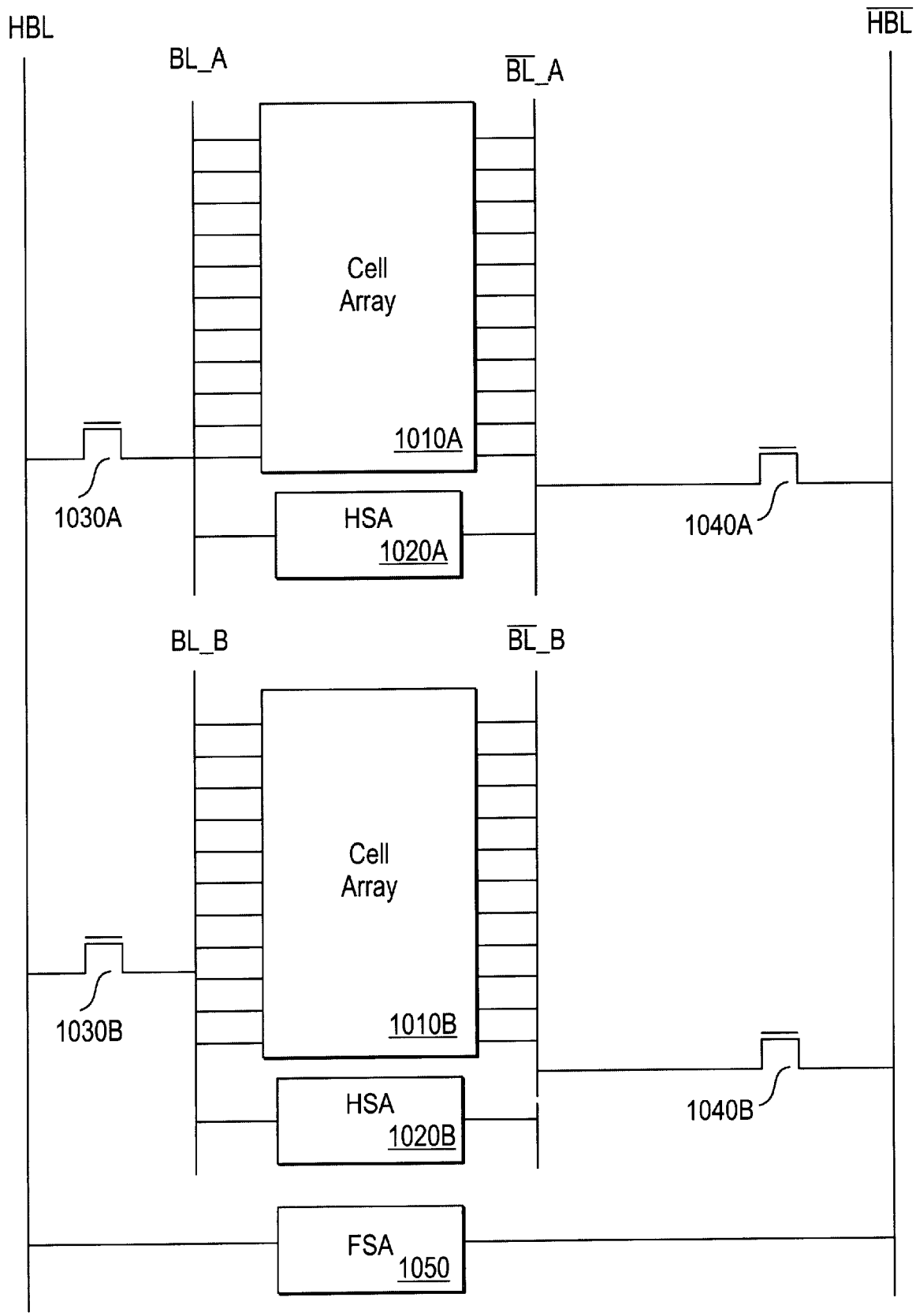
FIG. 10 illustrates an embodiment of a DRAM utilizing a hierarchical bit-line structure.

FIG. 10 illustrates an embodiment of a DRAM utilizing a hierarchical bit-line structure. Cell array 1010a is coupled to bitline A (BL_A) and to bitline bar A (BL_bar_A) such that each conductor (BL_A, BL_bar_A) may be coupled to various different cells. Half sense amplifier A (HSA 1020A) is similarly coupled to the two bitline conductors. A similar structure is duplicated below, in that bitline B (BL_B) and bitline bar B (BL_bar_B) are coupled to cell array 1010b and also coupled to half sense amplifier B (HSA 1020B).

At a higher hierarchical level, HBL conductor is coupled to BL_A through pass device 1030A and to BL_B through pass device 1030B. Similarly, HBL_bar is coupled to BL_bar_A through pass device 1040A and to BL_bar_B through pass device 1040B. Note that this cell and HSA structure may be repeated multiple times, allowing for a coupling ratio more in the neighborhood of 8:1 or 10:1 in one embodiment. Full sense amplifier 1050 (FSA 1050) is coupled to both HBL and HBL_bar, thus allowing for proper sense amplification at the higher hierarchical level of the DRAM. Preferably, device 1040A and device 1030A are operated in tandem to pass signals (share charge) between BL_A and HBL and BL_bar_A and HBL_bar. Likewise devices 1030B and 1040B are operated in tandem when charge sharing with BL__B and BL__bar__B is preferred. As a result, a single cell array out of a group of cell arrays coupled to an HBLHBL__bar pair may be selected, and a single cell out of that single cell array may then be sensed.

In the foregoing detailed description, the method and apparatus of the present invention has been described with reference to specific exemplary embodiments thereof. It will, however, be evident that various modifications and changes may be made thereto without departing from the broader spirit and scope of the present invention. In particular, the separate blocks of the various block diagrams represent functional blocks of methods or apparatuses and are not necessarily indicative of physical or logical separations or of an order of operation inherent in the spirit and scope of the present invention. For example, the various blocks of FIG. 7 may be integrated into components, or may be subdivided into components. Moreover, the blocks of FIG. 6 represent portions of a method which, in some embodiments, may be reordered or may be organized in parallel rather than in a linear or step-wise fashion. The present specification and figures are accordingly to be regarded as illustrative rather than restrictive.

What is claimed is:

1. A DRAM cell array comprising:
    a set of cells selectively coupled to a bitline conductor;
    a set of cells selectively coupled to a bitline bar conductor;
    a half sense amplifier selectively coupled to the bitline conductor and to the bitline bar conductor;
    a hierarchical bitline conductor selectively coupled to the bitline conductor;
    a hierarcliical bitline bar conductor selectively coupled to the bitline bar conductor;
    a full sense amplifier coupled to the hierarchical bitline conductor and the hierarchical bitline bar conductor; and
    the bitline conductor and the bitline bar conductor configured to change voltage potential in the same direction relative to a ground potential in response to coupling to the half sense amplifier.

2. A method of amplifying comprising:
    coupling a half sense amplifier to a bitline conductor and a bitline bar conductor; and
    amplifying a voltage differential between the bitline conductor and the bitline bar conductor through operation of the half sense amplifier, the bitline conductor and the bitline bar conductor changing voltage potential in the same direction relative to a ground potential during the operation of the half sense amplifier.

3. The method of claim 2 further comprising:
    precharging the bitline conductor and the bitline bar conductor;
    sharing charge between a cell and the bitline conductor;
    sharing charge between the bitline conductor and a hierarchical bitline conductor;
    sharing charge between the bitline bar conductor and a hierarchical bitline bar conductor;
    amplifying a voltage differential between the hierarchical bitline conductor and the hierarchical bitline bar conductor through operation of a full sense amplifier, the hierarchical bitline conductor and the hierarchical bitline bar conductor changing voltage potential in opposite directions relative to a ground potential.

4. An ASIC comprising:
    a digital logic circuit block;
    a DRAM circuit block, the DRAM circuit block including a set of cells selectively coupled to a half sense amplifier; and wherein:
        the DRAM circuit block includes a first set of cells selectively coupled to a bitline conductor and a second set of cells selectively coupled to a bitline bar conductor, the bitline conductor and tho bitline bar conductor selectively coupled to the half sense amplifier, the set of calls including the first set of cells and the second set of cells, the bitline conductor and the bitline bar conductor configured to change voltage potential in the same direction relative to a ground potential in response to operation of the half sense amplifier.

5. A method of amplifying signals in a DRAM comprising:
    sharing charge between a cell and a first conductor of a first pair of complementary conductors; and
    driving a voltage of the first conductor of the first pair and a voltage of a second conductor of the first pair in the same direction relative to a ground voltage responsive to an operation of a half sense amplifier between the first pair of complementary conductors.

6. The method of claim 5 further comprising;
    sharing charge between the first pair and a second pair of complementary conductors;
    driving a voltage of a first conductor of the second pair toward a power supply voltage; and
    driving a voltage of a second conductor of the second pair toward said ground voltage.

7. The method of claim 5 further comprising:
    sharing charge between the first pair and a second pair of complementary conductors; and
    driving a voltage of the first conductor of the second pair and a voltage a second conductor of the second pair in the same direction relative to a power supply voltage.

8. The method of claim 7 further comprising:
    sharing charge between the second pair and a third pair of complementary conductors;
    driving a voltage of a first conductor of the third pair toward said power supply voltage; and
    driving a voltage of a second conductor of the third pair toward a ground voltage.

* * * * *